(12) United States Patent
Kirn

(10) Patent No.: US 7,629,907 B2
(45) Date of Patent: Dec. 8, 2009

(54) SAMPLED SYSTEM AGILITY TECHNIQUE

(76) Inventor: Larry Kirn, 1602 S. Shore Dr., East Lansing, MI (US) 48823

( * ) Notice: Subject to any disclaimer, the term of this patent is extended or adjusted under 35 U.S.C. 154(b) by 371 days.

(21) Appl. No.: 11/108,243

(22) Filed: Apr. 18, 2005

(65) Prior Publication Data

US 2005/0231403 A1    Oct. 20, 2005

Related U.S. Application Data

(60) Provisional application No. 60/563,270, filed on Apr. 16, 2004.

(51) Int. Cl.
*H03M 1/00* (2006.01)

(52) U.S. Cl. ....................................... 341/123; 375/222

(58) Field of Classification Search ................. 341/123; 375/222, 223, 224; 711/150; 370/295, 480
See application file for complete search history.

(56) References Cited

U.S. PATENT DOCUMENTS

| 6,026,356 | A  | * | 2/2000  | Yue et al. ..................... 704/201 |
| 6,744,812 | B2 | * | 6/2004  | Anne et al. ................... 375/222 |
| 6,903,699 | B2 | * | 6/2005  | Porter et al. ................. 343/719 |
| 2004/0228417 | A1 | * | 11/2004 | Kennedy et al. ............ 375/260 |

* cited by examiner

*Primary Examiner*—Rexford N Barnie
*Assistant Examiner*—Joseph Lauture
(74) *Attorney, Agent, or Firm*—Dorsey & Whitney LLP

(57) ABSTRACT

A method of modulating the sampling period of a sampled system with a factor N, and correcting the data stream of the sampling system with the same factor N, thus minimizing distortion artifacts induced by sample frequency modulation. At least a one-period delay from receipt of a new data stream value is used to avoid heterodyning with the incoming stream.

7 Claims, 1 Drawing Sheet

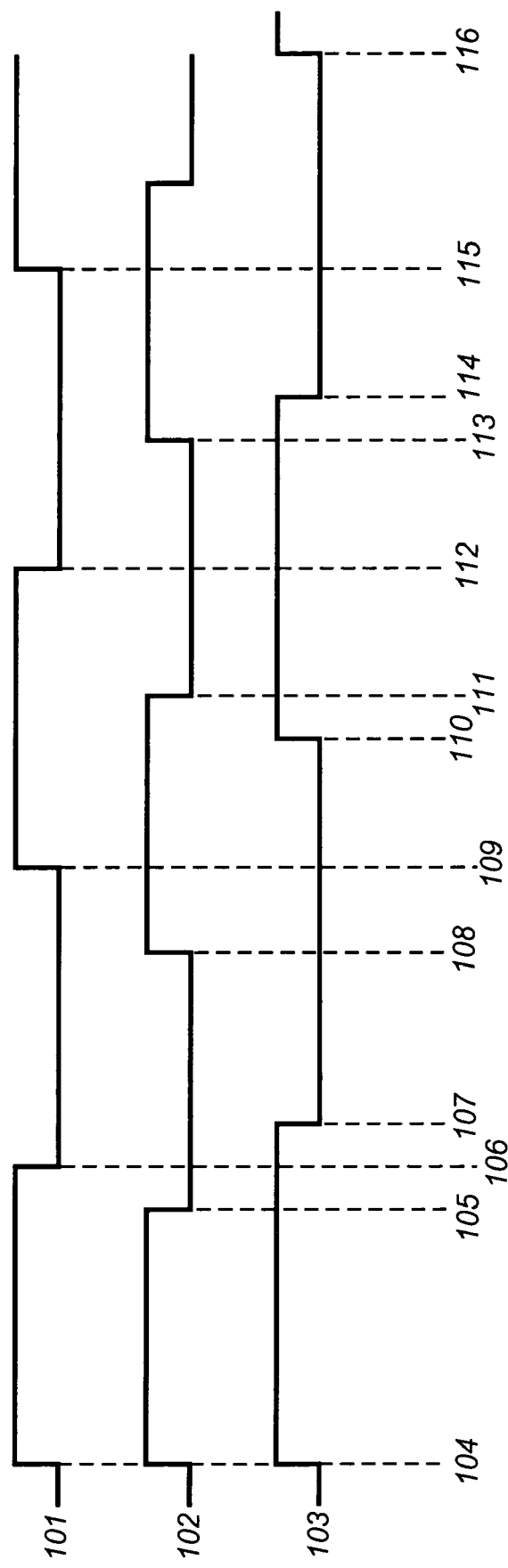

SAMPLED SYSTEM AGILITY TECHNIQUE

REFERENCE TO RELATED APPLICATION

This application claims priority to U.S. Provisional Patent Application Ser. No. 60/563,270, filed Apr. 16, 2004, the entire content of which is incorporated herein by reference.

FIELD OF THE INVENTION

This invention relates generally to sampled systems and, in particular, to a method whereby open-loop an sampled system can operate at minimal distortion at a variable-frequency sampling rate.

BACKGROUND OF THE INVENTION

Sampled systems, by their nature, generate alias product sum and difference frequencies around their sampling frequency, as well as numerous harmonics thereof. In many applications, such as AM radio receivers with switching output amplifiers, nearby circuitry may be deleteriously affected by one or more of a variable range of frequencies. Furthermore, objectionable sum and difference frequencies may be generated from interaction between a fixed-frequency sampled system and adjacent circuitry. In such cases, noise-modulated frequency control of the sampled system will disperse alias products across a wider bandwidth, minimizing their objectionability. Open-loop sampling systems, however, depend on a constant output integral gain for minimal distortion. A need exists for a method whereby open-loop sampled systems can operate at minimal distortion with variable-frequency sampling rate.

SUMMARY OF THE INVENTION

The present invention resides in a method of modulating the sampling period of a sampled system with a factor N, and correcting the data stream of the sampling system with the same factor N, thus minimizing distortion artifacts induced by sample frequency modulation. Implicit in the above technique is at least a one-period delay from receipt of a new data stream value, so as to avoid heterodyning with the incoming stream.

BRIEF DESCRIPTION OF THE DRAWINGS

FIG. 1 is a timing diagram associated with a preferred embodiment of the present invention.

DETAILED DESCRIPTION OF THE INVENTION

Referring now to FIG. 1, pulsewidth modulated outputs of a sampled system at three different output sample rates are shown in traces 101, 102, and 103. The same incoming datastream value is assumed for all three traces, and pulsewidths corrected by the invention are shown. The traces may represent voltage, current, or power; in an unspecified output configuration.

The output period of trace 101 is seen as the period between markers 104 and 109, repeated between markers 109 and 115. The output period of trace 102 is seen as the period between markers 104 and 108, repeated between markers 108 and 113. The output period of trace 103 is seen as the period between markers 104 and 110, repeated between markers 110 and 116.

Assuming positive-true output, the pulsewidth output of trace 101 can be seen to be the integral of the time period between markers 104 and 106 divided by the time period between markers 104 and 109. This output repeats as the integral of the time period between markers 109 and 112 divided by the time period between markers 109 and 115.

Referring now to trace 102, it can be seen that the output sampling period between markers 104 and 108 (or 108 and 113) is substantially shorter than that of trace 101 between markers 104 and 109 (or 109 and 115). If the same datastream value resulting in the pulsewidth assertion between markers 104 and 106 (109 and 112) were directly applied to the sampling period of trace 102, it can be seen that the integral of the time period between markers 104 and 106 divided by the time period between markers 104 and 108 would be significantly different than the integral of trace 101 described above.

By the present invention, the datastream value resultant in the pulsewidth between markers 104 and 106 of trace 101 is multiplied by the ratio of trace 102 period to trace 101 period, thereby providing a corrected datastream value resultant in the pulsewidth period between markers 104 and 105. The pulsewidth can again be seen between markers 108 and 110.

Referring now to trace 103, it can be seen that the output sampling period between markers 104 and 110 (or 110 and 116) is substantially longer than that of trace 101 between markers 104 and 109 (or 109 and 115). If the same datastream value resulting in the pulsewidth assertion between markers 104 and 106 (109 and 112) were directly applied to the sampling period of trace 103, it can be seen that the integral of the time period between markers 104 and 106 divided by the time period between markers 104 and 110 would be significantly different than the integral of trace 101 described above.

By the present invention, the datastream value resultant in the pulsewidth between markers 104 and 106 of trace 101 is multiplied by the ratio of trace 103 period to trace 101 period, thereby providing a corrected datastream value resultant in the pulsewidth period between markers 104 and 107. The pulsewidth can again be seen between markers 110 and 114.

By visual inspection, it can be seen that the integrals of traces 101, 102, and 103 are the same (within drawing tolerances) while the sampling periods are markedly different. The present invention can therefore be seen to mitigate pulsewidth distortions induced by sampling rate deviances. Use of the present inventions in systems utilizing static or dynamic output sampling frequency variances (of any waveform or waveforms) is anticipated.

I claim:

1. A method of operating an electronic system using a variable sampling rate, the method comprising:
    sampling a first portion of a data stream during each of a first plurality of sample periods having a first duration;
    generating a first output signal having a pulse during each of the first plurality of sample periods having the first duration, each pulse having a respective width corresponding to a value of the data stream during the respective sample period;
    scaling a second portion of the data stream by a factor;
    sampling the second portion of the data stream during each of a second plurality of sample periods having a second duration, the second duration different from the first duration by the factor; and
    generating a second output signal having a pulse during each of the second plurality of sample periods having the second duration, each pulse having a respective width corresponding to a value of the scaled data stream during the respective sample period wherein the act of sampling the second portion of the data stream is delayed by at least the first duration following receipt of a beginning of the second portion of the data stream.

2. The method of claim 1, wherein the first and second portions of the data stream are representative of voltage.

3. The method of claim 1, wherein the first and second portions of the data stream are representative of current.

4. The method of claim 1, wherein the first and second portions of the data stream are representative of power.

5. The method of claim 1 wherein the factor corresponds to a ratio between the first and second durations.

6. The method of claim 1 wherein the first duration is greater than the second duration.

7. The method of claim 1 wherein the second duration is greater than the first duration.

* * * * *

UNITED STATES PATENT AND TRADEMARK OFFICE
CERTIFICATE OF CORRECTION

PATENT NO.        : 7,629,907 B2                                    Page 1 of 1
APPLICATION NO. : 11/108243
DATED             : December 8, 2009
INVENTOR(S)       : Larry Kirn It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this

Second Day of November, 2010

David J. Kappos
*Director of the United States Patent and Trademark Office*